United States Patent
Tsutsumi (10) Patent No.: US 8,988,162 B2
(45) Date of Patent: Mar. 24, 2015

(54) FILTER AND DUPLEXER

(71) Applicant: Taiyo Yuden Co., Ltd., Tokyo (JP)

(72) Inventor: Jun Tsutsumi, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 275 days.

(21) Appl. No.: 13/666,512

(22) Filed: Nov. 1, 2012

(65) Prior Publication Data

US 2013/0141185 A1 Jun. 6, 2013

(30) Foreign Application Priority Data

Dec. 5, 2011 (JP) .................. 2011-265988

(51) Int. Cl.
*H03H 9/70* (2006.01)
*H03H 9/72* (2006.01)
*H03H 9/54* (2006.01)
*H03H 9/64* (2006.01)
*H03H 9/05* (2006.01)
*H03H 9/58* (2006.01)

(52) U.S. Cl.
CPC ............ *H03H 9/0566* (2013.01); *H03H 9/542* (2013.01); *H03H 9/584* (2013.01); *H03H 9/6433* (2013.01)
USPC ....................................... 333/133

(58) Field of Classification Search
CPC ... H03H 9/0566; H03H 9/6433; H03H 9/584; H03H 9/542; H03H 9/0871; H03H 9/0576; H03H 9/6489; H03H 9/6493; H03H 9/706; H03H 9/725; H03H 9/0571
USPC .................. 333/133, 193, 195, 189
See application file for complete search history.

(56) References Cited

U.S. PATENT DOCUMENTS

| 5,966,060 A | 10/1999 | Ikada | |
| 7,102,460 B2* | 9/2006 | Schmidhammer et al. | ... 333/133 |
| 2007/0296521 A1* | 12/2007 | Schmidhammer | ............ 333/133 |
| 2008/0284540 A1* | 11/2008 | Nishihara et al. | ............ 333/133 |
| 2011/0193654 A1* | 8/2011 | Miyake | ......................... 333/186 |

FOREIGN PATENT DOCUMENTS

| JP | 6-164309 | * | 6/1994 | ..................... 333/193 |
| JP | 6-260876 A | | 9/1994 | |
| JP | 7-38376 | * | 2/1995 | |
| JP | 10-93381 A | | 4/1998 | |
| JP | 2001-230657 A | | 8/2001 | |

OTHER PUBLICATIONS

Rao et al.; "Modeling and Design of a Wire Bonded Low Loss Single Ended DMS Filter Having Broadband Rejection of -45 dB"; 2007 IEEE Ultrasonics Symposium, Oct. 28-31, 2007, pp. 941-944.*
Inoue et al.; "Ultra-Steep Cut-Off Double Mode SAW Filter and Its Application to a PCS Duplexer"; IEEE Transactions on Ultrasonics, Ferroelectrics, and Frequency Control, vol. 54, No. 9, Sep. 2007, pp. 1882-1887.*

* cited by examiner

*Primary Examiner* — Barbara Summons
(74) *Attorney, Agent, or Firm* — Chen Yoshimura LLP (57) ABSTRACT

A filter includes: a coupled multi-mode acoustic wave filter connected between an input terminal and an output terminal; a first inductor connected between the coupled multi-mode acoustic wave filter and a ground terminal; an acoustic wave resonator, one end of which is connected between the input terminal or the output terminal and the coupled multi-mode acoustic wave filter; and a second inductor connected between another end of the acoustic wave resonator and the ground terminal.

7 Claims, 12 Drawing Sheets

FILTER AND DUPLEXER

CROSS-REFERENCE TO RELATED APPLICATION

This application is based upon and claims the benefit of priority of the prior Japanese Patent Application No. 2011-265988, filed on Dec. 5, 2011, the entire contents of which are incorporated herein by reference.

FIELD

A certain aspect of the present invention relates to a filter and a duplexer.

BACKGROUND

Filters used in communication devices such as mobile phones are required to have low loss in a passband, and to exhibit a high degree of suppression outside the passband. In recent years, the use of the direct conversion method removes an intermediate filter (IF filter), and further requires the high degree of suppression. Exemplary acoustic wave filters used as a filter are a SAW (Surface Acoustic Wave) filter and an FBAR (Film Bulk Acoustic Resonator) filter. However, the filter behaves as a capacitor at frequencies far away from the passband. Thus, the degree of suppression degrades at frequencies outside the passband, especially in a high frequency band.

A coupled multi-mode acoustic wave filter, which is formed by acoustically connecting SAW resonators or piezoelectric thin film resonators, is used to increase the degree of suppression in a wide frequency band. There is disclosed a technique that connects a resonator in series or in parallel to a DMS (Double Mode SAW) filter in Japanese Patent Application Publication Nos. 6-260876, 2001-230657 and 10-93381 (Patent Documents 1, 2 and 3). Moreover, Patent Document 3 discloses a technique that reduces an inductance of a bonding wire to improve the degree of suppression in a high frequency band.

However, conventional techniques are mainly directed to improve the degree of suppression around the passband, and have difficulty in improving the degree of suppression in a wide band, especially in a high frequency band. In addition, the reduction of the inductance disclosed in Patent Document 3 does not improve the degree of suppression sufficiently.

SUMMARY OF THE INVENTION

According to an aspect of the present invention, there is provided a filter including: a coupled multi-mode acoustic wave filter connected between an input terminal and an output terminal; a first inductor connected between the coupled multi-mode acoustic wave filter and a ground terminal; an acoustic wave resonator, one end of which is connected between the input terminal or the output terminal and the coupled multi-mode acoustic wave filter; and a second inductor connected between another end of the acoustic wave resonator and the ground terminal.

According to another aspect of the present invention, there is provided a duplexer including: a reception filter connected between a common terminal and a reception terminal; and a transmission filter connected between the common terminal and a transmission terminal, wherein the reception filter is the above described filter.

DETAILED DESCRIPTION

Figure 1A:
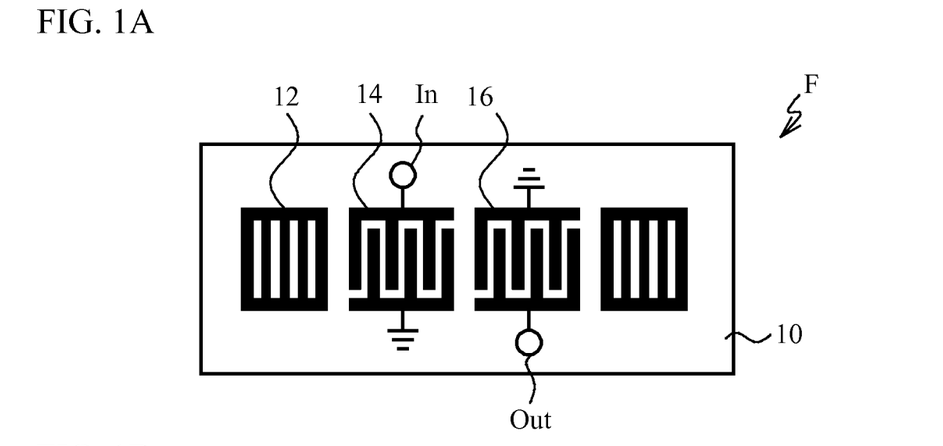
FIG. 1A is a top view of a DMS filter.
Figure 1B:
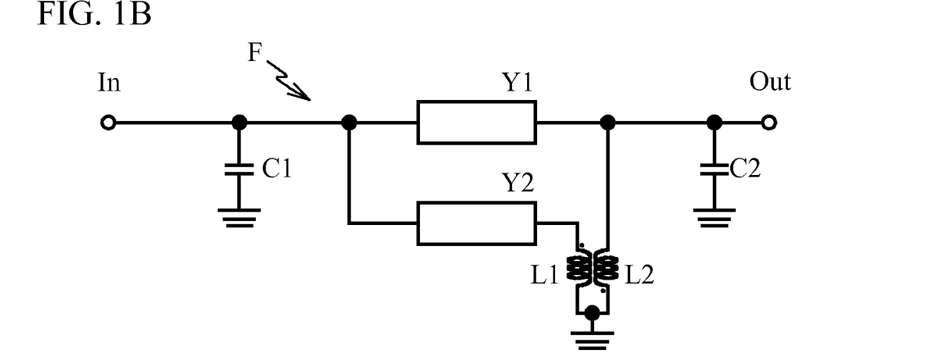
FIG. 1B is a circuit diagram illustrating an equivalent circuit of the DMS filter.

A DMS filter and a comparative example are first described to clarify a problem to be solved by embodiments. FIG. 1A is a top view of a DMS filter. FIG. 1B is a circuit diagram illustrating an equivalent circuit of the DMS filter. The number of electrode fingers in FIG. 1A is one example, and may be other numbers.

As illustrated in FIG. 1A, two reflectors 12, an IDT (Interdigital Transducer) 14 and an IDT 16 are located on a piezoelectric substrate 10 along a propagation direction of acoustic waves. The IDT 14 and the IDT 16 are adjacent to each other, and the reflectors 12 sandwich the IDT 14 and the IDT 16. One of comb-shaped electrodes of the IDT 14 is connected to an input terminal In, and the other one of the comb-shaped electrodes is connected to ground. One of comb-shaped electrodes of the IDT 16 is connected to an output terminal Out, and the other one of the comb-shaped electrodes is connected to ground. A high-frequency signal is input from the input terminal In. The IDT 14 excites acoustic waves having a frequency corresponding to a pitch of the electrode fingers. The IDT 16 converts propagated acoustic waves into an electrical signal, and outputs it to the output terminal Out. The reflectors 12 reflect acoustic waves leaking to a lateral direction to a direction toward the IDT.

As illustrated in FIG. 1B, the equivalent circuit of a DMS filter F is formed by capacitors C1 and C2, inductors L1 and L2, and admittances Y1 and Y2. The admittance Y1 is connected in series between the input terminal In and the output terminal Out. One end of the admittance Y2 is connected to a node between the input terminal In and the admittance Y1, and the other end is connected to one end of the inductor L1. One end of the inductor L2 is connected to a node between the output terminal Out and the admittance Y1. One end of the capacitor C1 is connected in parallel to a node between the input terminal In and the admittance Y1. One end of the capacitor C2 is connected to a node between the output terminal Out and the admittance Y1. The other ends of the inductors L1 and L2 and the capacitors C1 and C2 are connected to ground. The admittances Y1 and Y2 represent two resonance characteristics of the acoustic wave in the filter. The capacitor C1 corresponds to the capacitance of the IDT 14, and the capacitor C2 corresponds to the capacitance of the IDT 16. The inductors L1 and L2 are interconnected to have negative mutual inductances. When a frequency of a signal input to the DMS filter F is located far away from a passband, the admittances Y1 and Y2 come close to zero. Thus, the signal is hardly transmitted through the admittances Y1 and Y2.

Figure 1C:
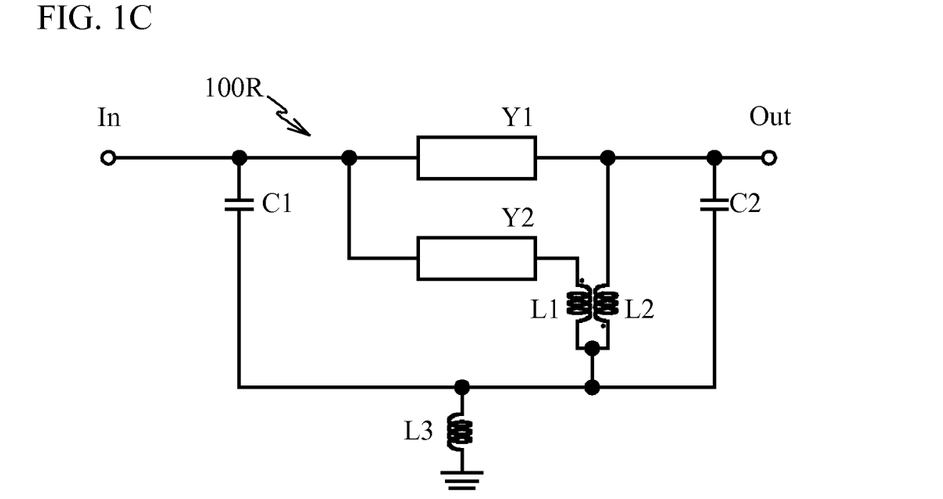
FIG. 1C is a circuit diagram illustrating an equivalent circuit of a filter in accordance with a first comparative example.

A first comparative example connects the above described DMS filter to ground through a common inductor. FIG. 1C is a circuit diagram illustrating an equivalent circuit of a filter 100R in accordance with the first comparative example. As illustrated in FIG. 1C, in the filter 100R, one end of an inductor L3 is connected to the other ends of the inductors L1 and L2 and the capacitors C1 and C2, and the other end is connected to ground. The inductor L3 is a parasitic inductor such as wirings, for example. Admittances of the capacitors C1 and C2 increase and an admittance of the inductor L3 decreases at high frequencies. Thus, a high-frequency signal input from the input terminal In is transmitted through the capacitors C1 and C2, and is output from the output terminal Out. This results in a degradation in the degree of suppression in a high frequency band.

When respective ground terminals are provided at a side of the input terminal In and at a side of the output terminal Out as illustrated in FIG. 1B, a signal outside the passband is less likely to be transmitted from the input terminal In to the output terminal Out. However, since the size of the filter should be reduced, it is difficult to provide separate ground terminals, and the ground terminal is generally shared. In addition, the high-frequency signal is easily transmitted through the inductor L3 by reducing an inductance $L_3$ of the inductor L3. Since the high-frequency signal is transmitted into the ground terminal through the inductor L3, the degree of suppression of the filter increases. When the inductor L3 is formed by wirings located in the multilayered substrate, the inductance can be reduced by increasing the number of via wirings that interconnect conductive layers of the multilayered substrate and making the size of the ground terminal large. However, the above described countermeasures prevent the reduction in the size of the filter. Next, a description will be given of a first embodiment.

First Embodiment

Figure 2A:
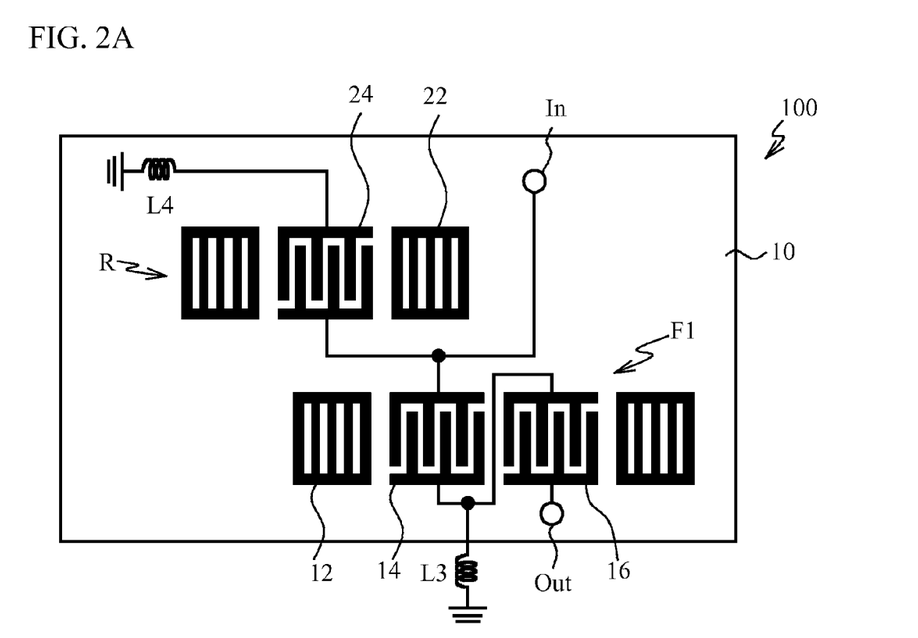
FIG. 2A is a top view of a filter in accordance with a first embodiment.
Figure 2B:
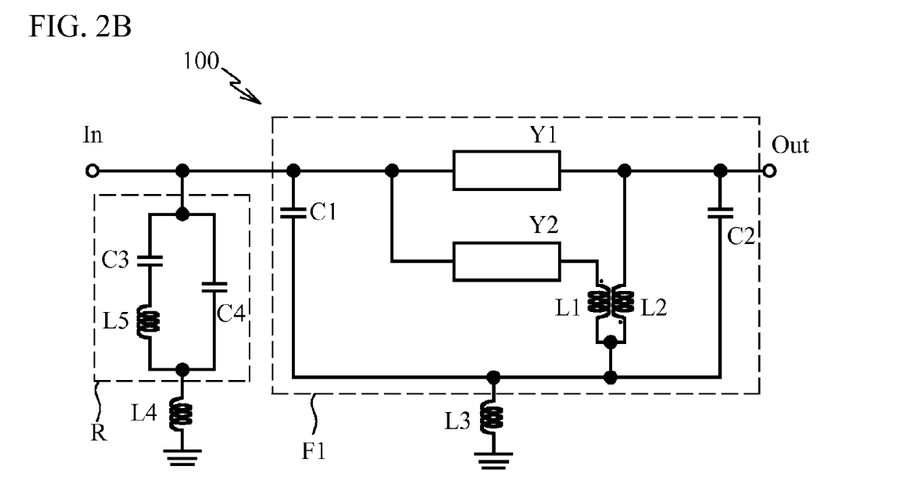
FIG. 2B is a circuit diagram illustrating an equivalent circuit of the filter of the first embodiment.

A first embodiment connects a resonator and an inductor in parallel between the DMS filter and a terminal. FIG. 2A is a top view of a filter 100 in accordance with the first embodiment. FIG. 2B is a circuit diagram illustrating an equivalent circuit of the filter 100 of the first embodiment.

As illustrated in FIG. 2A, the filter 100 includes a one-port resonant circuit R (hereinafter, described as resonator R), the inductor L3 (first inductor) and an inductor L4 (second inductor). The resonator R is connected in parallel between a DMS filter F1 and the input terminal In, the inductor L3 is connected between the DMS filter F1 and a ground terminal (not illustrated), and the inductor L4 is connected between the resonator R and the ground terminal. The resonator R is a surface acoustic wave resonator including two reflectors 22 and an IDT 24.

The input terminal In is connected to one of comb-shaped electrodes of the IDT 14 in the DMS filter F1. The output terminal Out is connected to one of comb-shaped electrodes of the IDT 16. One end of the inductor L3 is connected between the other one of the comb-shaped electrodes of the IDT 14 and the other one of the comb-shaped electrodes of the IDT 16. One of comb-shaped electrodes of the IDT 24 in the resonator R is connected between the input terminal In and the IDT 14. One end of the L4 is connected to the other one of the comb-shaped electrodes of the IDT 24. The other ends of the inductors L3 and L4 are connected to ground. The piezoelectric substrate 10 is made of a piezoelectric substance such as 42° rotated Y-cut lithium tantalate (LiTaO$_3$) or lithium niobate (LNbO$_3$). The IDTs and the reflectors are made of a metal such as aluminum (Al).

As illustrated in FIG. 2B, the resonator R corresponds to a circuit in which an inductor L5 and a capacitor C3, which are connected in series, are connected in parallel to a capacitor C4, and is connected between the input terminal In and the admittance Y1. The capacitor C4 and the inductor L4 form an attenuation pole in a high frequency band of a frequency characteristic of the filter 100. Thus, the degree of suppression increases in the high frequency band. In addition, the connection of the resonator R increases the degree of suppression around the passband. The resonator R and the inductor L4 may be connected between the input terminal In and the IDT 14, or between the output terminal Out and the IDT 16. The first embodiment does not provide separate ground terminals at the sides of the input terminal In and output terminal Out, and does not reduce the inductance $L_3$. Thus, the size of the filter can be reduced.

Second Embodiment

Figure 3A:
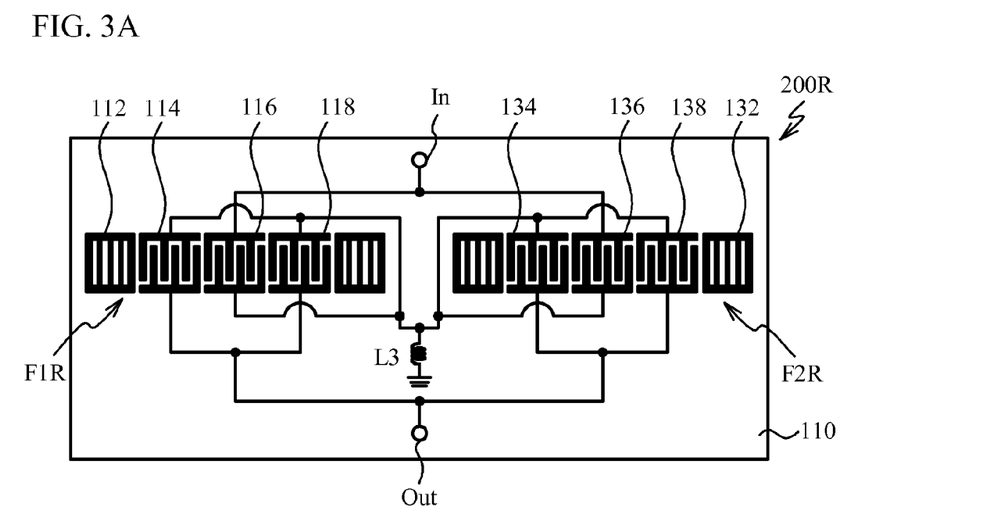
FIG. 3A is a top view of a filter in accordance with a second comparative example.

A second embodiment changes the number of DMS filters. A description will be given of a second comparative example that is a filter using two DMS filters. FIG. 3A is a top view of a filter 200R in accordance with the second comparative example.

As illustrated in FIG. 3A, the filter 200R includes two DMS filters F1R and F2R which are connected in parallel between the In and the Out. The input terminal In is connected to one of comb-shaped electrodes of each of an IDT 116 and an IDT 136. The output terminal Out is connected to one of comb-shaped electrodes of each of IDTs 114, 118, 134 and 138. One end of the inductor L3 is connected to the other one of the comb-shaped electrodes of each IDT, and the other end is connected to ground. Reflectors 112 are arranged so as to sandwich the IDTs 114, 116 and 118, and reflectors 132 are arranged so as to sandwich the IDTs 134, 136 and 138.

Figure 3B:
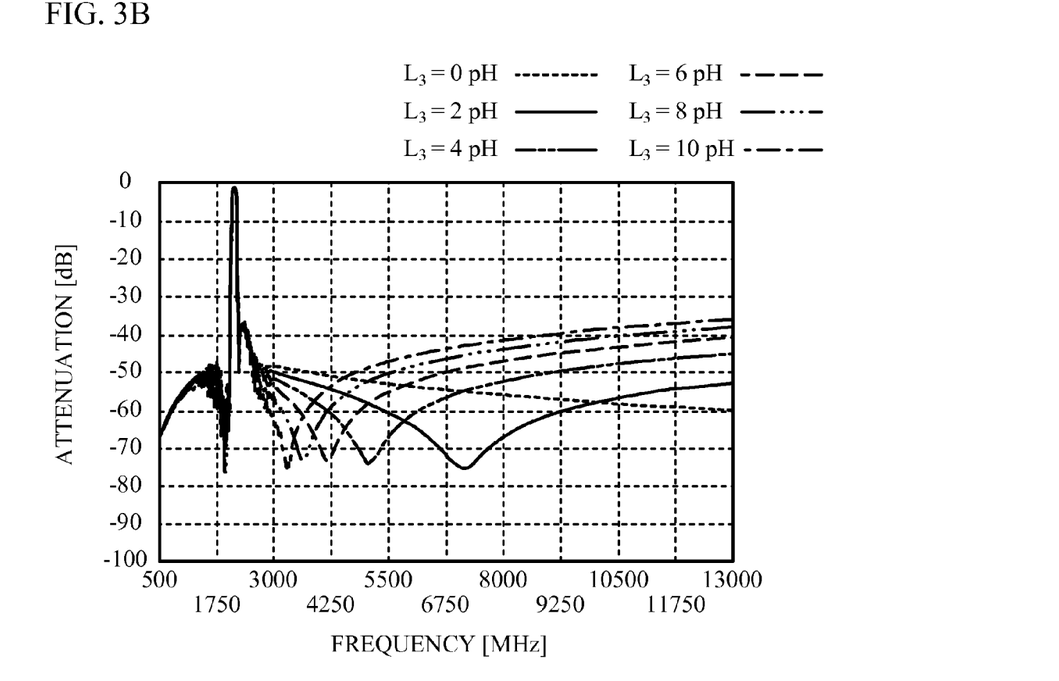
FIG. 3B is a graph illustrating a frequency characteristic of the filter of the second comparative example.

The inductance $L_3$ is changed to 0, 2, 4, 6, 8 and 10 pH, and a frequency characteristic of the filter 200R is calculated. Frequency characteristics of the DMS filters F1R and F2R are calculated using the coupling of modes theory, and the inductor L3 is added in a circuit simulator. Assume a piezoelectric substrate 110 is made of LiTaO$_3$. The passband of the filter is located in a reception band of Band 1 of WCDMA (Wideband Code Division Multiple Access) (2110 to 2170 MHz). FIG. 3B is a graph illustrating a frequency characteristic of the filter in accordance with the second comparative example. A horizontal axis represents frequency, and a vertical axis represents attenuation. A dotted line indicates a case of $L_3$=0 pH, a solid line indicates a case of $L_3$=2 pH, a long dashed double-dotted line indicates a case of $L_3$=4 pH, a dashed line indicates a case of $L_3$=6 pH, a long dashed triple-dotted line indicates a case of $L_3$=8 pH, and a chain line indicates a case of $L_3$=10 pH.

As illustrated in FIG. 3B, in the case of $L_3$=0 pH, the attenuation pole is not formed at frequencies higher than the passband. When the inductance $L_3$ is larger than 0, the attenuation pole is formed in a range of 3000 to 8000 MHz, and the attenuation pole is shifted to a high frequency side with the decrease in the inductance $L_3$. The degree of suppression increases at the attenuation pole, but the degree of suppression degrades in a frequency band higher than the frequency of the attenuation pole. For example, even when the inductance $L_3$ takes a small value such as 2 pH, deterioration in the degree of suppression is observed in a frequency band higher than 10 GHz.

Figure 4A:
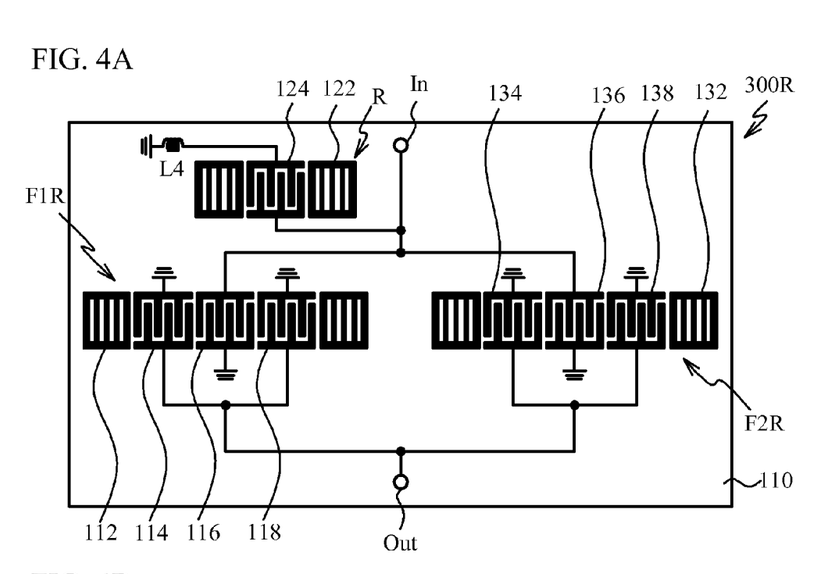
FIG. 4A is a top view of a filter in accordance with a third comparative example.

A description will now be given of a third comparative example. The third comparative example does not use the inductor L3, but uses a resonator and the inductor L4. FIG. 4A is a top view of a filter 300R in accordance with the third comparative example.

As illustrated in FIG. 4A, the filter 300R includes the resonator R and the L4. The resonator R includes two reflectors 122 and an IDT 124. One of comb-shaped electrodes of the IDT 124 is connected between the input terminal In and the DMS filters F1R and F2R, and the other one of the comb-shaped electrodes is connected to one end of the inductor L4. The other end of the inductor L4 is connected to ground.

Figure 4B:
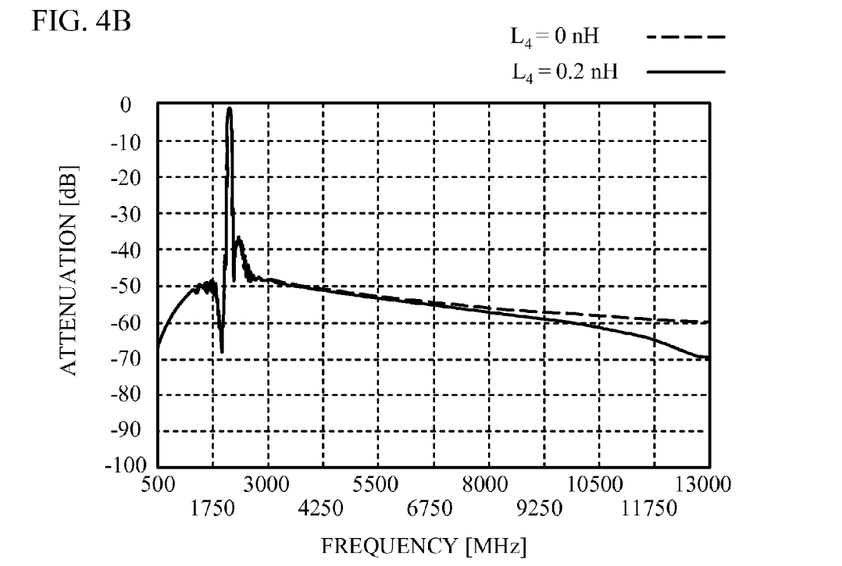
FIG. 4B is a graph illustrating a frequency characteristic of the filter of the third comparative example.

An inductance $L_4$ of the inductor L4 is changed to calculate a frequency characteristic in the third comparative example. FIG. 4B is a graph illustrating a frequency characteristic of the filter of the third comparative example. A dashed line indicates a case of $L_4$=0 nH, and a solid line indicates a case of $L_4$=0.2 nH.

As indicated by the solid line in FIG. 4B, in the case of $L_4$=0.2 nH, the attenuation pole is formed at around 13 GHz. Thus, compared to the case of $L_4$=0 nH, the degree of suppression increases in the frequency band higher than 10 GHz.

Figure 5A:
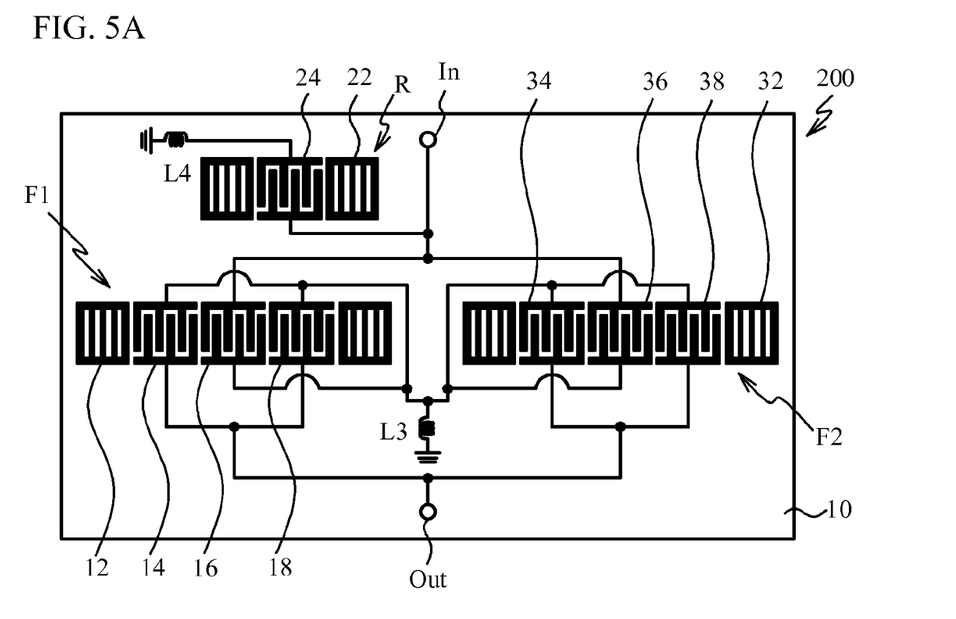
FIG. 5A is a top view of a filter in accordance with a second embodiment.

A description will now be given of a second embodiment. FIG. 5A is a top view of a filter 200 in accordance with the second embodiment.

As illustrated in FIG. 5A, the filter 200 includes DMS filters F1 and F2 located on the piezoelectric substrate 10, the resonator R, and the inductors L3 and L4. The DMS filter F1 includes the reflectors 12, the IDTs 14, 16 and 18. The DMS filter F2 includes reflectors 32, IDTs 34, 36 and 38. The inductor L3 is connected between the DMS filters F1 and F2 and the ground terminal in the same manner as the second comparative example. The inductor L4 is connected between the resonator R and the ground terminal in the same manner as the third comparative example.

Figure 5B:
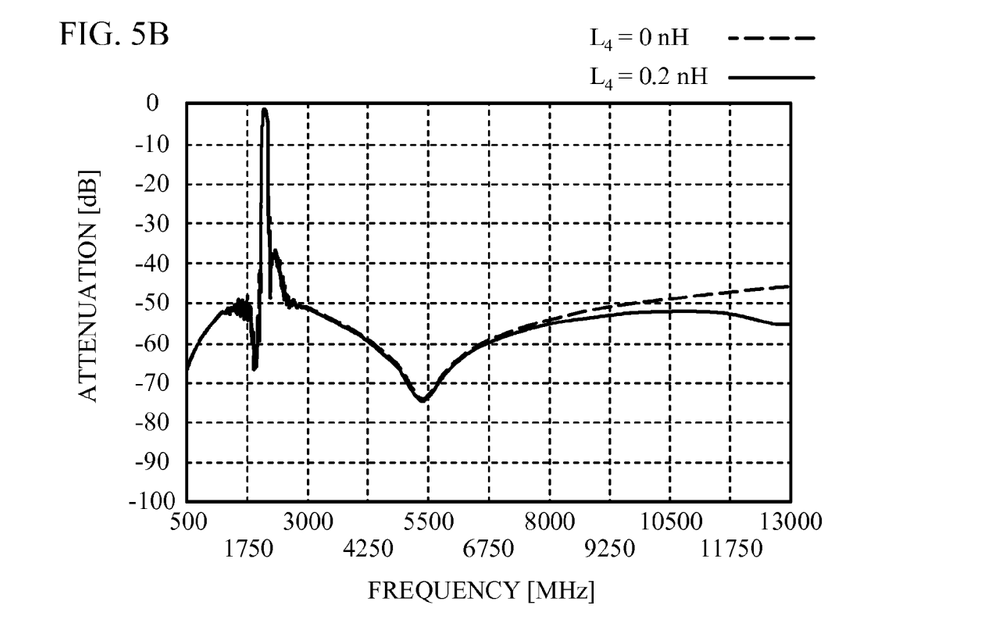
FIG. 5B is a graph illustrating a frequency characteristic of the filter of the second embodiment.

A frequency characteristic of the filter of the second embodiment is calculated, and compared to the frequency characteristic of the filter of which the $L_4$ is made to be equal to 0 nH. The $L_3$ is made to be equal to 6 pH. FIG. 5B is a graph illustrating a frequency characteristic of the filter of the second embodiment. A dashed line indicates a case of $L_4$=0 nH, and a solid line indicates a case of $L_4$=0.2 nH.

As illustrated in FIG. 5B, the inductor L3 forms the attenuation pole at around 5500 MHz. In the case of $L_4$=0.2 nH, the resonator R and the inductor L4 additionally form the attenuation pole at around 13 GHz, and thus the degree of suppression in a high frequency band increases compared to the case of $L_4$=0 nH.

The number of DMS filters connected between the In and the Out may be three or more. It is possible to use other coupled multi-mode surface acoustic wave filters such as a filter in which SAW filters are cascade-connected besides the DMS filter. In addition, it is also possible to use other coupled multi-mode acoustic wave filters such a coupled multi-mode boundary acoustic wave filter in which boundary acoustic wave filters are coupled. The resonator R may be other acoustic wave resonators such as a boundary acoustic wave resonator.

Third Embodiment

Figure 6A:
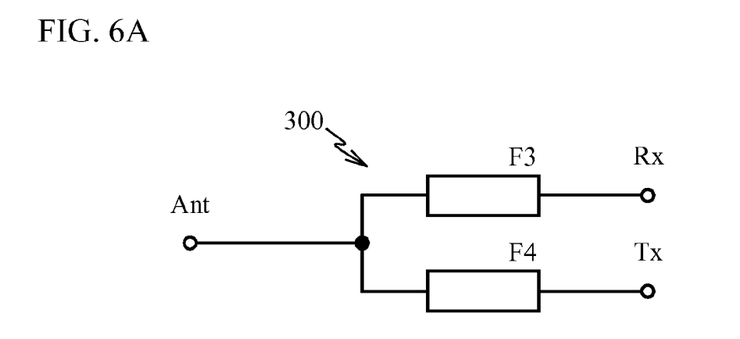
FIG. 6A is a block diagram illustrating a duplexer.
Figure 6B:
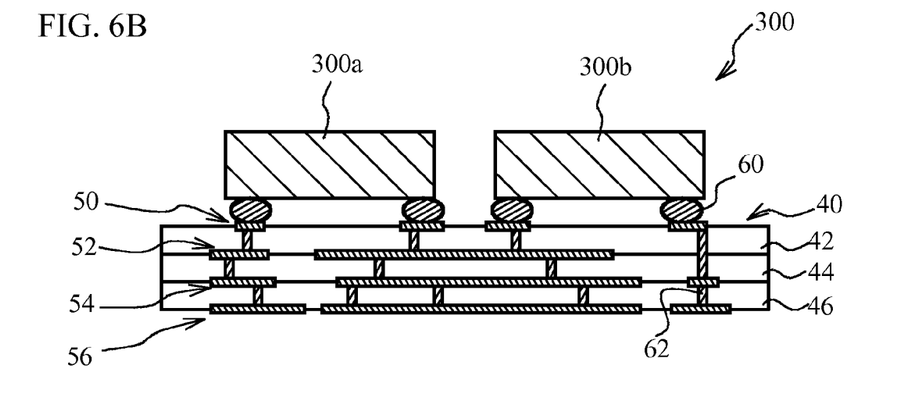
FIG. 6B is a cross-sectional view of a duplexer including a multi-layered substrate.

A third embodiment is an exemplary duplexer. FIG. 6A is a block diagram illustrating a duplexer. As illustrated in FIG. 6A, in a duplexer 300, a reception filter F3 is connected in series between an antenna terminal Ant (common terminal) and a reception terminal Rx, and a transmission filter F4 is connected in series between the antenna terminal Ant and a transmission terminal Tx. The duplexer is formed by mounting the filter chips on the substrate. FIG. 6B is a cross-sectional view of a duplexer including a multilayered substrate.

As illustrated in FIG. 6B, the duplexer 300 includes a multilayered substrate 40, and a reception filter chip 300a and a transmission filter chip 300b that are flip-chip mounted on the multilayered substrate 40. The reception filter chip 300a is a chip including the DMS filters F1 and F2, and the resonator R illustrated in FIG. 5A for example. The multilayered substrate 40 is a substrate formed by stacking a dielectric layer such as resin or ceramic, and a conductive layer made of a metal such as copper (Cu) for example. A first dielectric layer 42, a second dielectric layer 44, and a third dielectric layer 46 are formed in this order from the upper side of the multilayered substrate 40. A first conductive layer 50 is located on an upper surface (die attach surface) of the first dielectric layer 42. A second conductive layer 52 is located between the first dielectric layer 42 and the second dielectric layer 44. A third conductive layer 54 is located between the second dielectric layer 44 and the third dielectric layer 46 (foot pad layer). A fourth conductive layer 56 is located on a bottom surface of the third dielectric layer 46. Each filter chip is mounted on the first conductive layer 50 via bumps 60. The conductive layers are interconnected by via wirings 62 piercing through the dielectric layers.

Figure 7A:
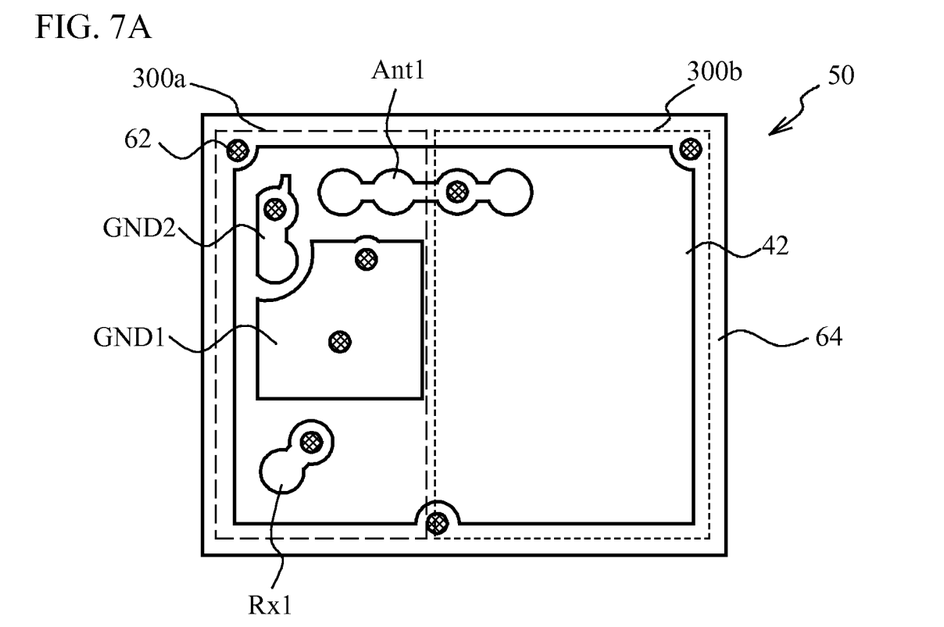
FIG. 7A is a top view of a first dielectric layer.
Figure 7B:
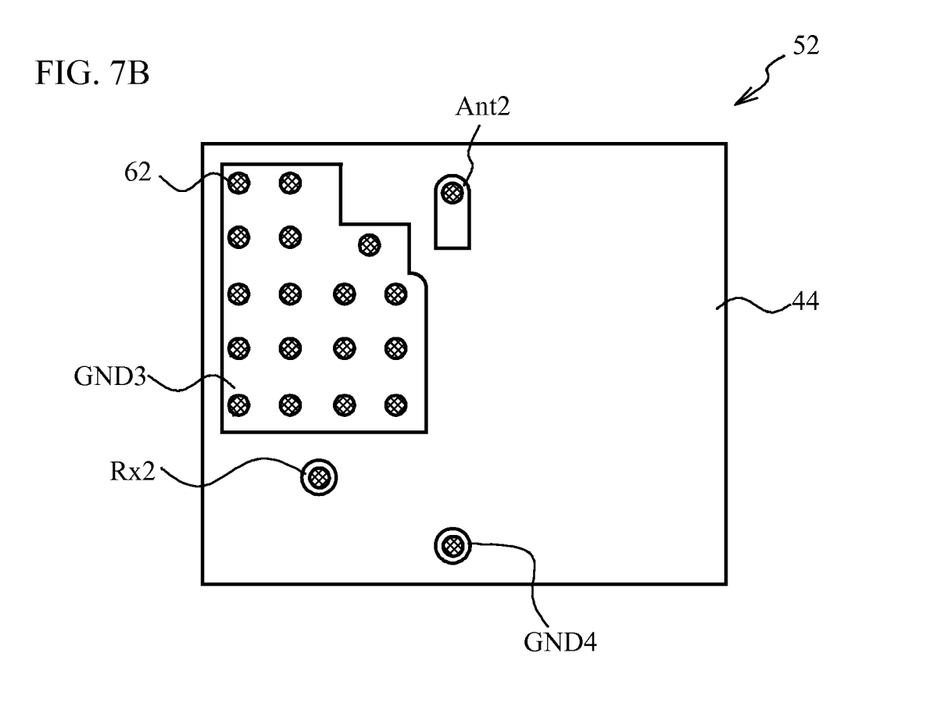
FIG. 7B is a top view of a second dielectric layer.
Figure 8A:
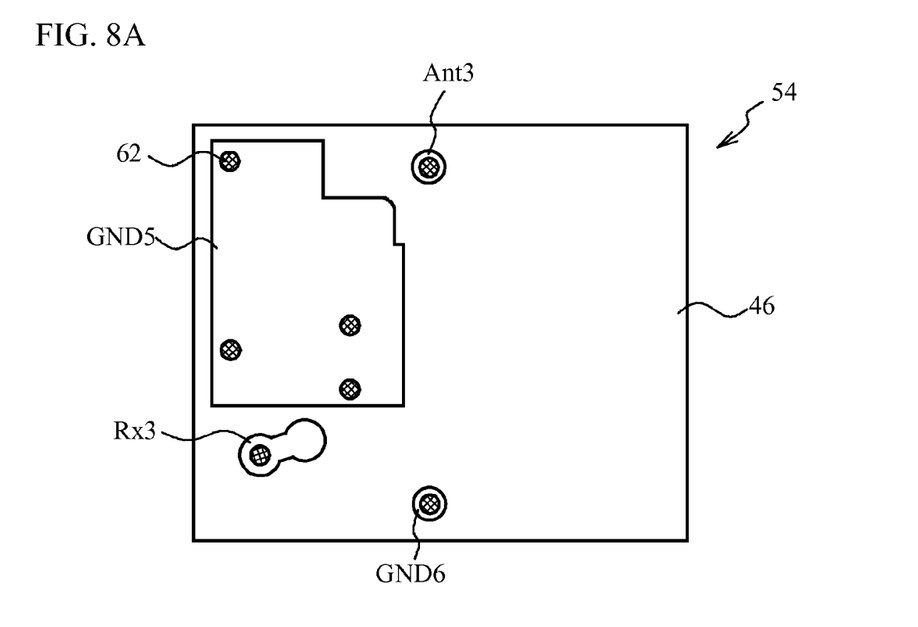
FIG. 8A is a top view of a third dielectric layer.
Figure 8B:
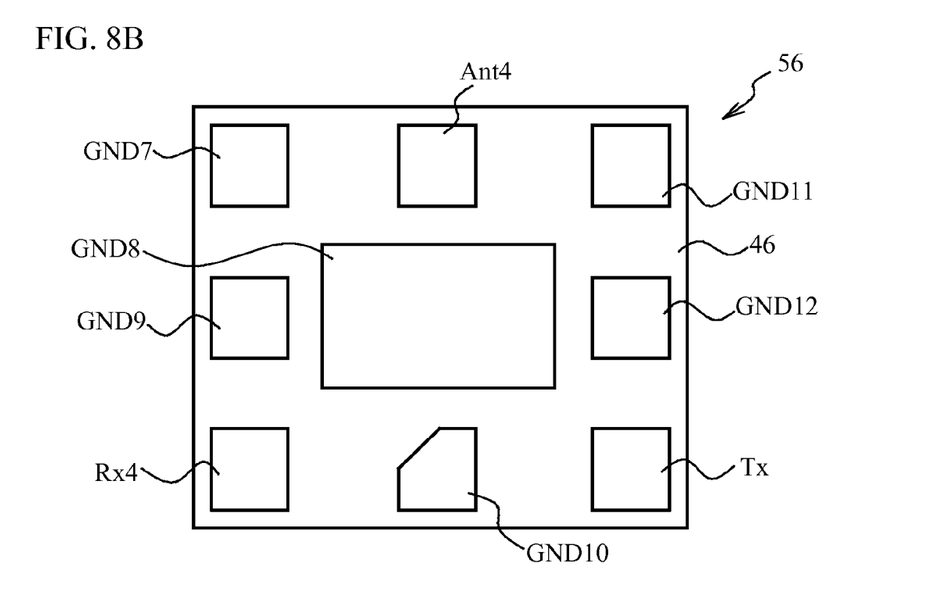
FIG. 8B is a diagram illustrating the third dielectric layer transparently.

FIG. 7A is a top view of the first dielectric layer 42. FIG. 7B is a top view of the second dielectric layer 44. FIG. 8A is a top view of the third dielectric layer 46. FIG. 8B is a diagram illustrating the third dielectric layer 46 transparently. Hatched parts represent the via wirings 62 extending from an upper surface to a bottom surface of each conductive layer in the drawings. Terminals and wirings in a region in which the transmission filter chip 300b is mounted are not illustrated in each conductive layer.

The reception filter chip 300a is mounted in a region indicated by a dashed line, and the transmission filter chip 300b is mounted in a region indicated by a dotted line in FIG. 7A. The first conductive layer 50 includes an antenna terminal Ant1, a reception terminal Rx1, ground terminals GND1 and GND2, and a circular electrode 64. The antenna terminal Ant1 corresponds to the input terminal In in FIG. 5A, and the reception terminal Rx1 corresponds to the output terminal Out. The ground terminal GND1 is connected to the DMS filters F1 and F2 of the reception filter chip 300a. The ground terminal GND2 is connected to the resonator R.

As illustrated in FIG. 7B, the second conductive layer 52 includes an antenna terminal Ant2, a reception terminal Rx2, and ground terminals GND3 and GND4. The antenna terminal Ant2 is connected to the antenna terminal Ant1 of the first conductive layer 50. The reception terminal Rx2 is connected to the reception terminal Rx1. The ground terminal GND3 is connected to the ground terminals GND1 and GND2. The ground terminal GND4 is connected to the circular electrode 64.

As illustrated in FIG. 8A, the third conductive layer 54 includes an antenna terminal Ant3, a reception terminal Rx3, and ground terminals GND5 and GND6. The antenna terminal Ant3 is connected to the antenna terminal Ant2 of the second conductive layer 52. The reception terminal Rx3 is connected to the reception terminal Rx2. The ground terminal GND5 is connected to the ground terminal GND3. The ground terminal GND6 is connected to the ground terminal GND4.

As illustrated in FIG. 8B, the fourth conductive layer 56 includes an antenna terminal Ant4, a reception terminal Rx4, the transmission terminal Tx, and ground terminals GND7 through GND12. The antenna terminal Ant4 is connected to the antenna terminal Ant3 of the third conductive layer 54. The reception terminal Rx4 is connected to the reception terminal Rx3. The transmission terminal Tx and the ground terminals GND11 and GND12 are connected to the transmission filter chip 300b. The ground terminals GND7 through GND9 are connected to the ground terminal GND5. The ground terminal GND10 is connected to the ground terminal GND6.

The inductor L3 is formed by the ground terminal GND1 and the via wirings 62 that connect the DMS filters F1 and F2 to the ground terminal GND3. The inductor L4 is formed by the ground terminal GND2 and the via wirings 62 that connect the resonator R to the ground terminal GND3. Thus, the degree of suppression increases in a high frequency band of the reception filter. In addition, the conductive layers in the multilayered substrate 40 function as the inductors L3 and L4, and thus the size of the duplexer is reduced.

Figure 9:
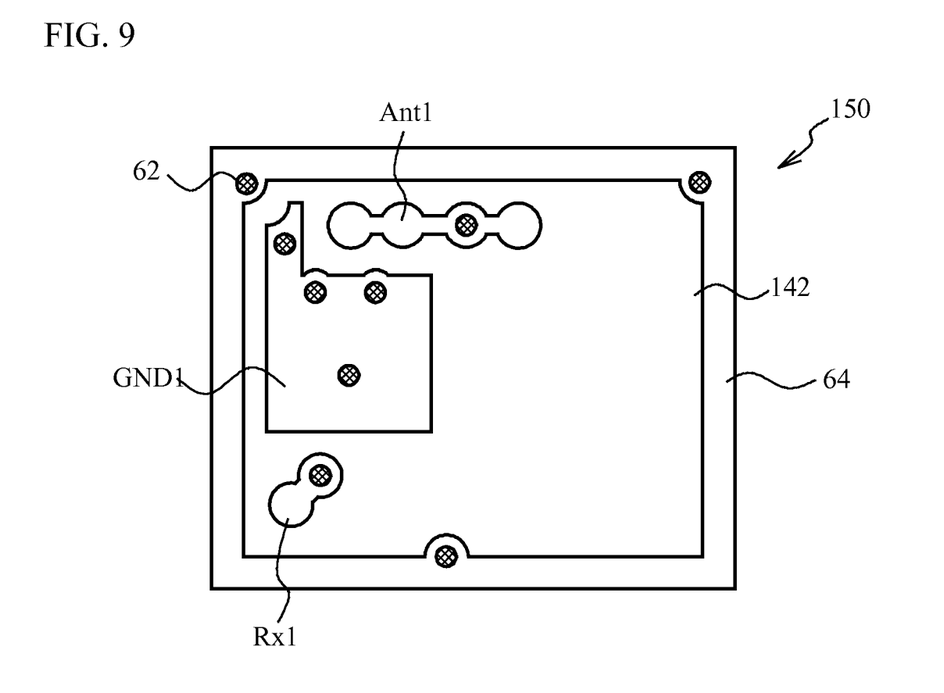
FIG. 9 is a plain view of a first conductive layer of a multilayered substrate included in a duplexer in accordance with a fourth comparative example.

A frequency characteristic of the reception filter in the duplexer of the third embodiment is calculated, and compared to calculation results of a fourth comparative example. A duplexer in accordance with the fourth comparative example includes a filter chip and a multilayered substrate as with the one illustrated in FIG. 6B. A reception filter chip of the fourth comparative example includes two DMS filters and the resonator R. FIG. 9 is a top view of the first dielectric layer in the multilayered substrate included in the duplexer of the fourth comparative example.

As illustrated in FIG. 9, a first conductive layer 150 located on a first dielectric layer 142 includes the ground terminal GND1 commonly connected to the two DMS filters and the resonator. This prevents separate inductors from being formed between the DMS filter and the ground terminal GND1 and between the resonator and the ground terminal GND1. The second, third and fourth conductive layers are the same as those illustrated in FIG. 7B through FIG. 8B.

Figure 10:
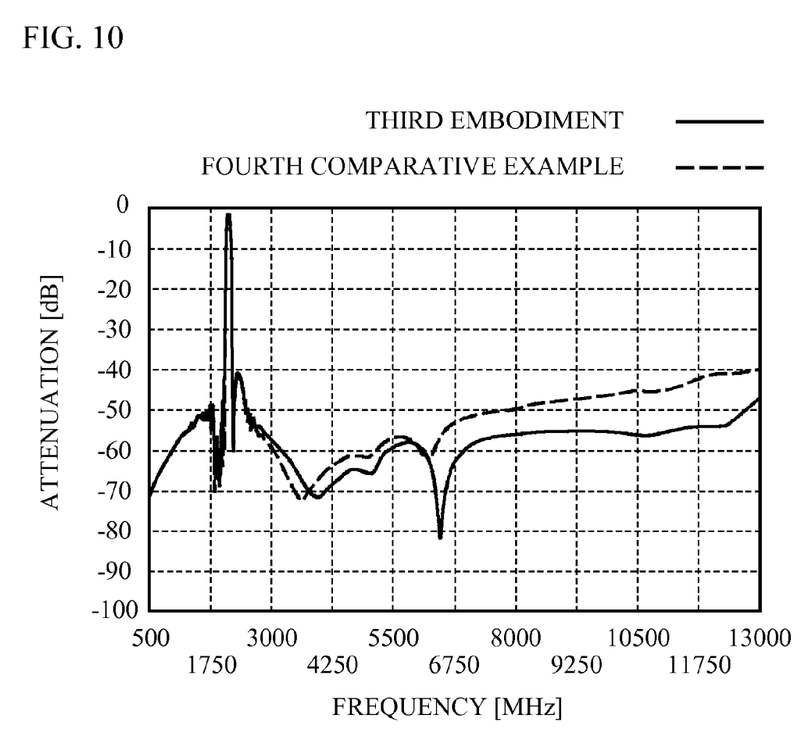
FIG. 10 is a graph illustrating a frequency characteristic of a reception filter included in a duplexer in accordance with a third embodiment.

FIG. 10 is a graph illustrating a frequency characteristic of the reception filter F3 included in the duplexer 300 in accordance with the third embodiment. A solid line and a dashed line indicate calculation results of the third embodiment and the fourth comparative example respectively. As illustrated in FIG. 10, the attenuation pole is formed at around 4000 MHz in the fourth comparative example and the third embodiment. In the fourth comparative example, the degree of suppression degrades in a frequency band higher than 6000 MHz, and the degradation becomes large as the frequency becomes high. In the third embodiment, the attenuation pole is formed at around 12 GHz by the resonator and the inductor L4. In addition, the attenuation pole is formed at around 6700 MHz. As a result, the third embodiment obtains the high degree of suppression in a frequency band higher than 7000 MHz. Especially, the degree of suppression at around 10 GHz is largely improved.

It is preferable that the ground terminal to which the DMS filter and the resonator are commonly connected is provided to the conductive layer other than the first conductive layer 50 to form the inductors L3 and L4. The ground terminal GND3 of the second conductive layer 52 is shared in the third embodiment, but the ground terminal of the third conductive layer 54 or the fourth conductive layer 56 may be shared. The number of layers of the multilayered substrate 40 may be changed. The DMS filter and the resonator may be formed on separate chips.

Fourth Embodiment

Figure 11A:
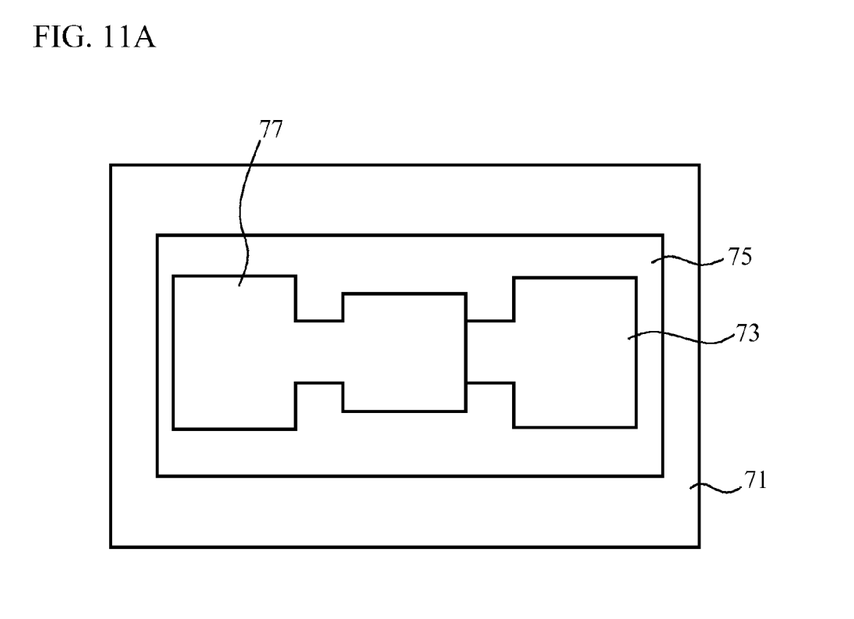
FIG. 11A is a top view of a piezoelectric thin film resonator.
Figure 11B:
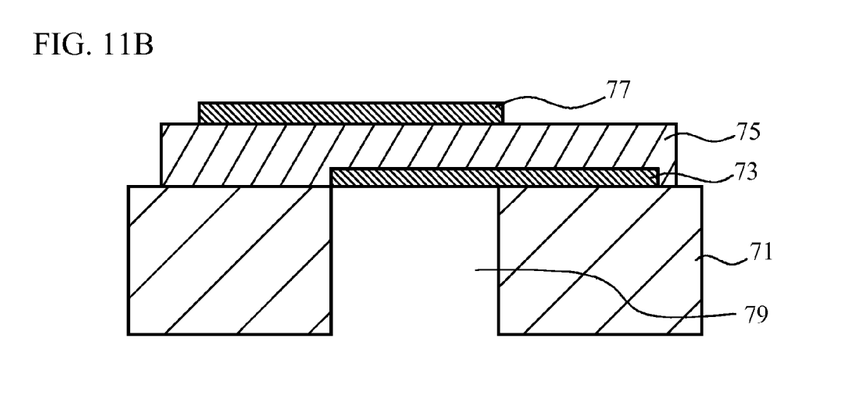
FIG. 11B is a cross-sectional view of the piezoelectric thin film resonator.

The fourth embodiment uses a piezoelectric thin film resonator. FIG. 11A is a top view of the piezoelectric thin film resonator. FIG. 11B is a cross-sectional view of the piezoelectric thin film resonator.

As illustrated in FIG. 11A and FIG. 11B, a lower electrode 73 is located on a substrate 71. A piezoelectric thin film 75 is located on the lower electrode 73. An upper electrode 77 is located on the piezoelectric thin film 75. The lower electrode 73, the piezoelectric thin film 75 and the upper electrode 77 overlap each other above a space 79 formed in the substrate 71. The above-described piezoelectric thin film resonator may be used for the resonator R. The lower electrode 73 may be exposed to the space 79, or an insulating film may be located between the lower electrode 73 and the space 79. A space may be located between the lower electrode 73 and the substrate 71. The acoustic reflection film may be located instead of forming the space 79 in the substrate 71.

Figure 12A:
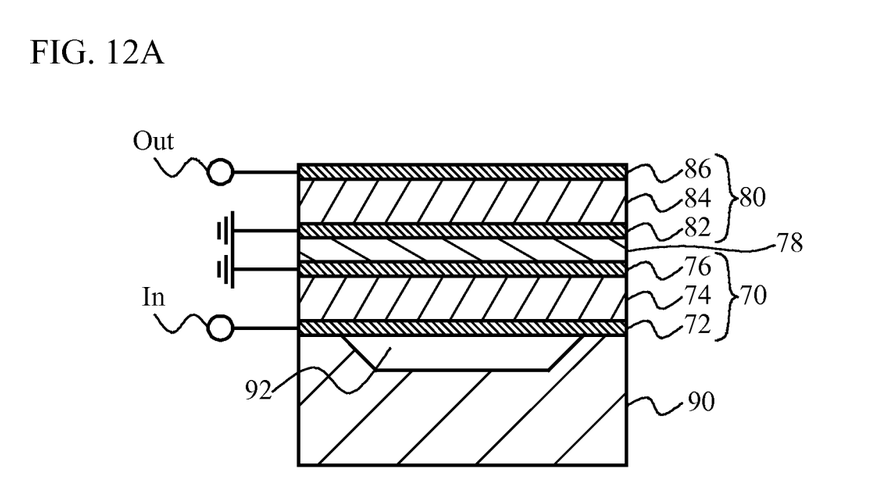
FIG. 12A and FIG. 12B are cross-sectional views of a CRF.
Figure 12B:
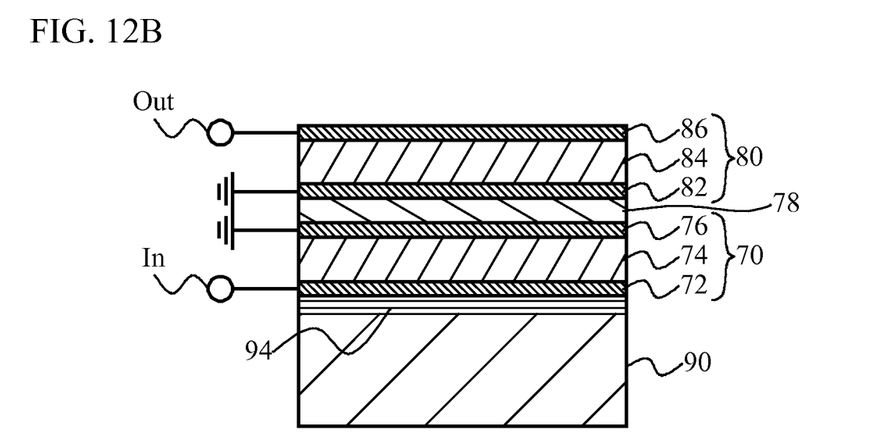

FIG. 12A and FIG. 12B are cross-sectional views illustrating a CRF. The CRF (Coupled Resonator Filter, coupled piezoelectric thin film resonator filter) may be used instead of a DMS filter. A first resonator 70 and a second resonator 80 are stacked on a substrate 90 so as to sandwich a decoupler film 78, where the first resonator 70 and the second resonator 80 are piezoelectric thin film resonators (e.g. Film Bulk Acoustic Resonator: FBAR). The first resonator 70 includes a lower electrode 72, a piezoelectric thin film 74, and an upper electrode 76. The second resonator 80 includes a lower electrode 82, a piezoelectric thin film 84, and an upper electrode 86. In addition, a space 92 is formed between the lower electrode 72 of the first resonator 70 and the substrate 90.

The lower electrode 72 of the first resonator 70 is connected to the input terminal In, and the upper electrode 86 of the second resonator 80 is connected to the output terminal Out. The upper electrode 76 of the first resonator 70 and the lower electrode 82 of the second resonator 80 are connected to ground.

The piezoelectric thin films 74 and 84 may be made of a material composed of aluminum nitride (AlN) to which an element such as alkali earth metal (e.g. scandium (Sc)) or rare-earth metal (e.g. erbium (Er)) that increases a piezoelectric constant is added. In addition, PZT (Lead Zirconate Titanate) or BST (Barium Strontium Titanate), which has a piezoelectricity larger than that of AlN, may be used instead of the above described material. The use of the above described materials achieves a bandpass filter having a sufficient bandwidth and low-loss characteristics compared to the use of AlN piezoelectric film to which an element for increasing the piezoelectric constant is not added. A piezoelectric constant (piezoelectric strain constant) of a general AlN piezoelectric film is 1.55 $C/m^2$, but the present embodiment increases the piezoelectric constant to 3.0 C/m² by addition of the element that increases the piezoelectric constant.

Silicon (Si) may be used for the substrate 90. Tungsten (W) may be used for an electrode film that forms the lower electrodes 72 and 82 and the upper electrodes 76 and 86. Silicon dioxide (SiO₂) may be used for the decoupler film 78. As illustrated in FIG. 12B, an acoustic reflection film 94 may be provided instead of providing the space 92 in the substrate 90. The resonator R may use the same material as that of the CRF.

A balance-type filter has a high degree of suppression because signals between balanced terminals have same phase in a frequency band away from the passband. On the contrary, although the degree of suppression in a high frequency band easily degrades in a single-ended filter, the degree of suppression can be efficiently improved using the embodiments. The embodiments may be applied to the balance-type filters. The embodiments are preferably applied to a reception filter which requires high suppression in a high frequency band. The embodiments may be applied to a transmission filter. A communication method supported by the filter may be other than Band 1 of WCDMA. The embodiments may be applied to one of or both of the reception filter and the transmission filter included in the duplexer, but is preferably applied to the reception filter to improve the frequency characteristic of the duplexer effectively. The embodiments may be applied to modules including a filter or a duplexer besides filters and duplexers.

Although the embodiments of the present invention have been described in detail, it is to be understood that the various change, substitutions, and alterations could be made hereto without departing from the spirit and scope of the invention.

What is claimed is:

1. A filter comprising:
   a coupled multi-mode acoustic wave filter connected between an input terminal and an output terminal;
   a first inductor connected between the coupled multi-mode acoustic wave filter and a ground terminal;
   an acoustic wave resonator, one end of which is connected between the input terminal or the output terminal and the coupled multi-mode acoustic wave filter; and
   a second inductor connected between another end of the acoustic wave resonator and the ground terminal,
   wherein:
   the first inductor forms a first attenuation pole at a frequency higher than a passband of the filter; and
   the acoustic wave resonator and the second inductor form a second attenuation pole at a frequency higher than the first attenuation pole.

2. The filter according to claim 1, further comprising:
   a multilayered substrate including dielectric layers and conductive layers; wherein
   the coupled multi-mode acoustic wave filter and the acoustic wave resonator are flip-chip mounted on the multilayered substrate, and
   the first inductor and the second inductor are formed by at least one of the conductive layers.

3. The filter according to claim 2, wherein
   the ground terminal is provided to a first conductive layer other than a second conductive layer in which the coupled multi-mode acoustic wave filter and the acoustic wave resonator are mounted, the first conductive layer and the second conductive layer being included in the conductive layers.

4. The filter according to claim 1, wherein
   the coupled multi-mode acoustic wave filter is a coupled multi-mode surface acoustic wave filter.

5. The filter according to claim 1, wherein
   the coupled multi-mode acoustic wave filter is a coupled piezoelectric thin film resonator filter.

6. The filter according to claim 1, wherein
   the coupled multi-mode acoustic wave filter includes acoustic wave filters connected in parallel between the input terminal and the output terminal.

7. A duplexer comprising:
   a reception filter connected between a common terminal and a reception terminal; and
   a transmission filter connected between the common terminal and a transmission terminal, wherein
   the reception filter is the filter according to claim 1.

* * * * *